US006950997B2

(12) United States Patent
Dickey et al.

(10) Patent No.: US 6,950,997 B2
(45) Date of Patent: Sep. 27, 2005

(54) METHOD AND SYSTEM FOR LOW NOISE INTEGRATED CIRCUIT DESIGN

(75) Inventors: Carl E. Dickey, Alburg, VT (US); Scott M. Parker, Jericho, VT (US); Raminderpal Singh, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 10/249,640

(22) Filed: Apr. 28, 2003

(65) Prior Publication Data

US 2004/0216060 A1 Oct. 28, 2004

(51) Int. Cl.[7] .................................................. G01L 17/50

(52) U.S. Cl. ..................... 716/2; 716/8; 716/9; 716/10; 716/11

(58) Field of Search .......................... 716/2, 4–6, 8–11; 703/14–16; 702/64–65, 70

(56) References Cited

U.S. PATENT DOCUMENTS

| | | | | | |
|---|---|---|---|---|---|
| 6,117,182 | A | * | 9/2000 | Alpert et al. | 716/8 |
| 6,212,490 | B1 | * | 4/2001 | Li et al. | 703/14 |
| 6,721,924 | B2 | * | 4/2004 | Patra et al. | 716/2 |
| 6,834,380 | B2 | * | 12/2004 | Khazei | 716/10 |
| 2002/0022951 | A1 | * | 2/2002 | Heijningen et al. | 703/16 |
| 2002/0095648 | A1 | * | 7/2002 | Saito | 716/10 |
| 2002/0147553 | A1 | * | 10/2002 | Shimazaki et al. | 702/65 |
| 2002/0147555 | A1 | * | 10/2002 | Nagata et al. | 702/70 |
| 2003/0208725 | A1 | * | 11/2003 | Shibata et al. | 716/1 |
| 2004/0060016 | A1 | * | 3/2004 | Patra et al. | 716/2 |
| 2004/0143804 | A1 | * | 7/2004 | Ueno et al. | 716/4 |

* cited by examiner

*Primary Examiner*—Matthew Smith
*Assistant Examiner*—Naum Levin
(74) *Attorney, Agent, or Firm*—Schmeiser, Olsen & Watts; Richard A. Henkler

(57) ABSTRACT

A method for designing an integrated circuit by a user, including: evaluating noise parameters for design elements of an integrated circuit design; determining if the noise parameters meet noise constraints of the integrated circuit design; and if the noise parameters do not meet the noise constraints, selecting alternative design elements having noise parameters that do meet the noise constraints.

24 Claims, 5 Drawing Sheets

METHOD AND SYSTEM FOR LOW NOISE INTEGRATED CIRCUIT DESIGN

BACKGROUND OF INVENTION

Field of the Invention

The present invention relates to the field of integrated circuit design; more specifically, it relates to method and system for designing low noise integrated circuits.

Advanced analog/mixed signal and radio frequency integrated circuit designers as well as designers of other integrated circuits are faced with an ever increasingly difficult task of verifying their designs for noise tolerance as the physical size, complexity and operating frequency of integrated circuits increase. Today, a trade-off between taking an excessive amount of time to verify the design accurately and the accuracy and reliability of the verification must be made. Often, as a consequence of this trade-off, products do not perform as well as planned or an unacceptable schedule of planned customers deliveries results with resultant loss of revenue.

SUMMARY OF INVENTION

A first aspect of the present invention is a method for designing an integrated circuit by a user, comprising: evaluating noise parameters for design elements of an integrated circuit design; determining if the noise parameters meet noise constraints of the integrated circuit design; and if the noise parameters do not meet the noise constraints, selecting alternative design elements having noise parameters that do meet the noise constraints.

A second aspect of the present invention is a system for designing an integrated circuit by a user, comprising: means for evaluating noise parameters for design elements of an integrated circuit design; means for determining if the noise parameters meet noise constraints of the integrated circuit design; and means for selecting alternative design elements having noise parameters that do meet the noise constraints if the noise parameters do not meet the noise constraints.

A third aspect of the present invention is a program storage device readable by machine, tangibly embodying a program of instructions executable by the machine to perform method steps for designing an integrated circuit by a user the method steps comprising: evaluating noise parameters for design elements of an integrated circuit design; determining if the noise parameters meet noise constraints of the integrated circuit design; and if the noise parameters do not meet the noise constraints, selecting alternative design elements having noise parameters that do meet the noise constraints.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

Figure 1:
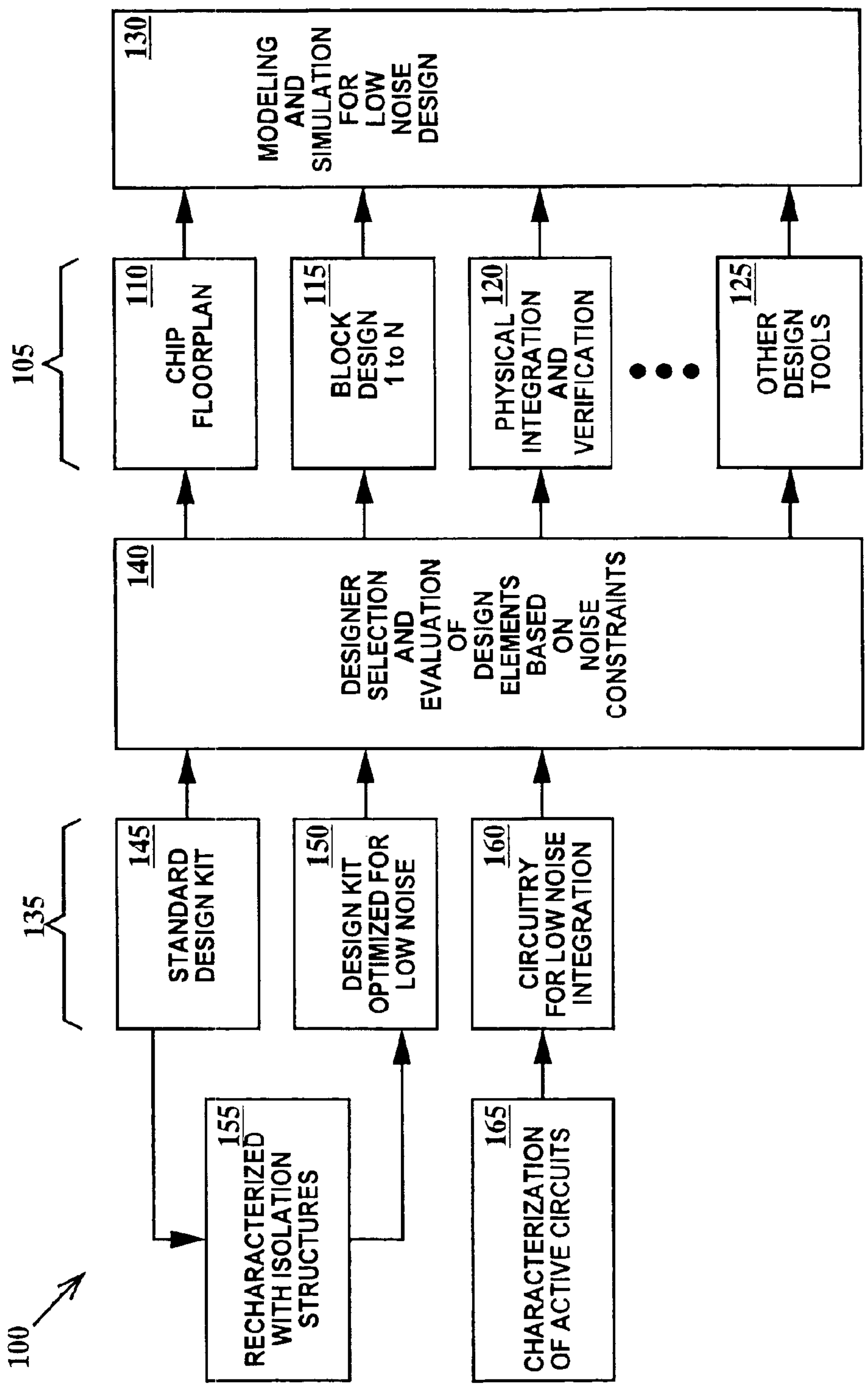
FIG. 1 is a block diagram of a design automation framework defining a methodology for designing a low noise integrated circuit according to the present invention.

FIG. 1 is a block diagram of a design automation framework defining a methodology for designing a low noise integrated circuit according to the present invention. In FIG. 1, a design automation framework 100 includes a set of design steps 105. Design steps 105 include chip floor planning sub-steps 110, block design sub-steps 115 (which operates on blocks of a range of block complexity from simple circuit block design through functional block design), physical integration and verification sub-steps 120 (which integrates the results of chip floor planning sub-steps 110 and block design sub-steps 115) and one or more other design sub-steps 125 as required. Not every design automation framework 100 need include every design step 105 illustrated in FIG. 1. Design steps 105 include tools computer aided design (CAD) tools available from, for example, Cadence Corp. of San Jose, Calif., Synopsys Corp of Mountainview, Calif., and propriety tools such as International Business Machines" (Armonk, N.Y.) Powerspice.

The integrated circuit design created by design steps 105 is analyzed by one or more model/simulator tools 130 for low noise design functionality. Examples of types of model/simulator tools 130 include tools that perform chip substrate noise analysis, chip to package and within chip interconnect noise analysis, parasitic noise extraction and others.

Design elements from process design kits 135 are manually or automatically selected and manually or automatically evaluated in by design selection and evaluation function 140 before being passed to design steps 105. Design selection and evaluation function 140 applies a set of noise constraints defining limits on generation by and sensitivity to noise on signal, power and clock paths of integrated circuit modules, integrated circuit chip substrates and devices (i.e. active devices such as transistors as well as passive devices such as capacitors and resistors and transmission lines) and integrated circuit interconnects. Noise constraints may be modulated by chip area, pin counts, power limits, voltage levels, timing requirements, signal frequency and clock frequency. Design selection and evaluation function 140 may be automated to any extent deemed suitable and limited only by processor capacity, time and the degree of accuracy required.

Process design kits 135 include a standard design kit 145 (having design elements without noise isolation structures), a low noise optimized design kit 150 (having noise tolerant design elements as well as noise isolation design elements and based on standard design kit 145) generated by a re-characterization tool 155 and calibrated to specific processes, a low noise circuit design kit 160 optimized for low noise and generated by an active device characterization tool 165 calibrated to specific fabrication processes and/or groundrules. Process design kits 135 are essentially design element libraries containing many variations of a set of base design elements. Design kits may include digital analog libraries. Design elements include, but are not limited to, single passive or active devices as described supra, analog and digital circuits and sub-circuits, logic books (ie. logic gates such as AND, NAND, OR and NOR) and functional blocks. Using the example of a wireless chip, functional blocks include but are not limited to digital signal processors (DSP), digital to analog (D/A) converters, radio frequency (RF) receivers, memory arrays and microprocessors. Further examples of design elements include transmission lines and transmission line shielding and noise suppression elements.

Each design element in each process design kit 135 has noise related parameters associated with it (or may be calculated for each design element). The first noise parameter is a noise signature parameter, i.e. how much noise does the element generate. The second noise parameter is a noise sensitivity parameter, i.e. how sensitive is the propagating in the circuit, substrate and interconnects. A third noise parameter, if the design element is used in an active circuit, is a noise suppression parameter, i.e. how much noise attenuation can the element supply. Examples of noise suppression or attenuation design elements include, but are not limited to active and passive guard ring circuits.

Figure 2:
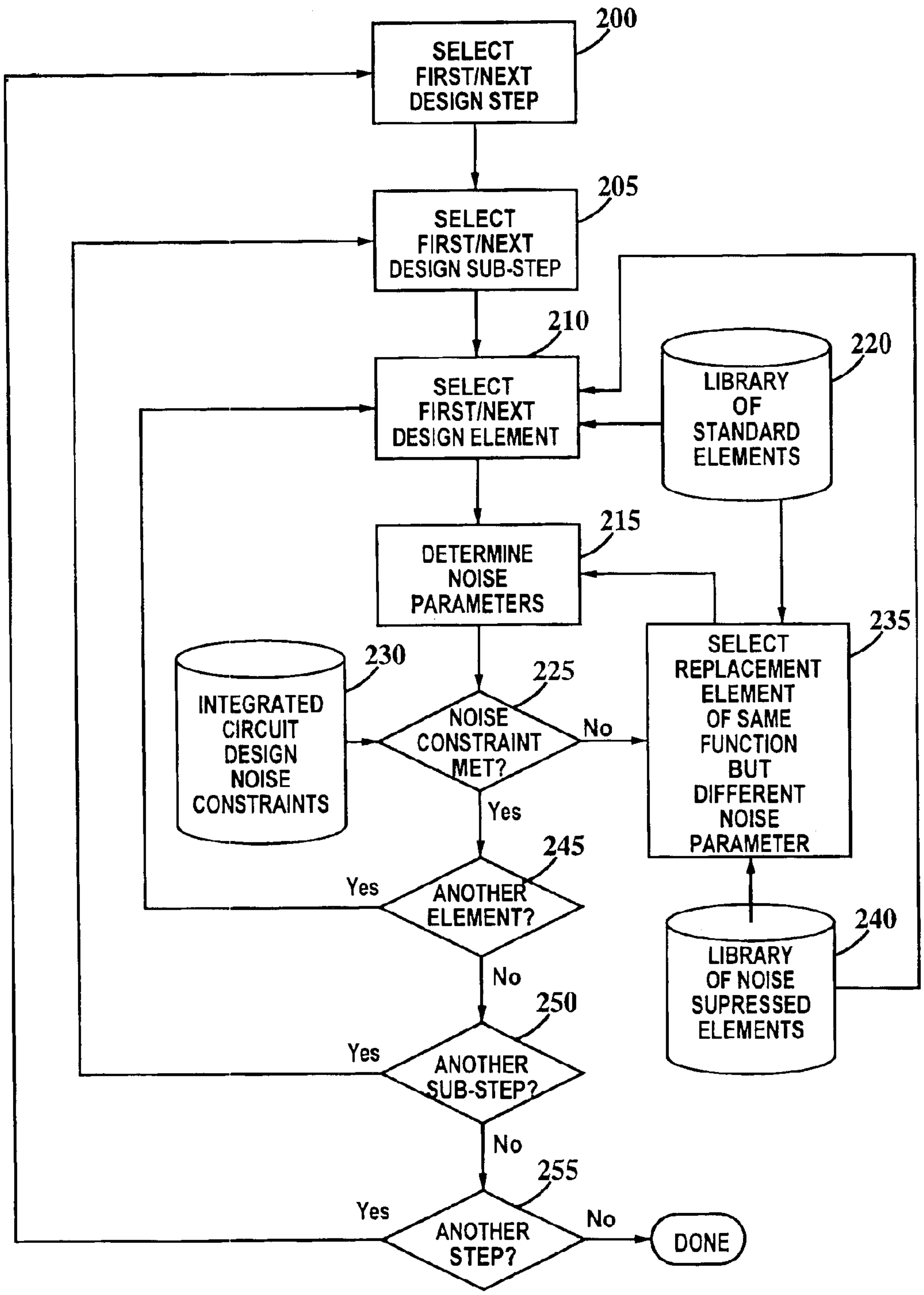
FIG. 2 is a flowchart of a method for designing a low noise integrated circuit according to the present invention.

FIG. 2 is a flowchart of a method for designing a low noise integrated circuit according to the present invention. In step 200, the first design step (or next design step if this is the second or more time through step 200) required for designing the low noise integrated circuit is selected. Next, because there are many sub-steps required of any given design step involved in an integrated circuit design, in step 205, the first design sub-step (or next design sub-step if this is the second or more time through step 205) to be applied to the integrated circuit design in the current design step is selected. Then, because there are many design elements required in given design step involved in an integrated circuit design, in step 210, the first design element (or next design element if this is the second or more time through step 210) is selected from a library of standard (i.e. non-noise suppressed) elements 220 (e.g., design kit 145 of FIG. 1) to be included in the integrated circuit design in the current design step.

In step 215, the noise parameters applicable to the current design element, design step and design tool are determined. In step 225, it is determined if noise constraints are met by the current design element by comparing the noise parameters of the current design element to predetermined noise constraints. Noise constraints may be selected either automatically or manually from a integrated circuit design noise constraint file 230 or entered directly by the designer. If in step 225, the current elements" noise parameters do not meet the noise constraints then in step 235 a replacement element of the same function but having different noise parameters is selected. The replacement element is selected from a library of noise-suppressed elements 240 (i.e. low noise optimized design kit 150 and circuit design kit 160 illustrated in FIG. 1 and described supra) and the method loops back to step 215. Note library 240 not only contains replacement elements but also may contain noise suppression elements, such as active and passive guard rings, transmission line alternatives and dedicated bond pad alternatives to be combined with the current design element. Under some circumstances such as 1/f noise, a replacement design element may be selected from library of standard elements 220. Under some circumstances the initially selected design element selected in step 210 may be selected from library of noise-suppressed elements 240.

If in step 225, the design noise constraint is met, then the method proceeds to step 245. In step 245 it is determined if there is another design element to be selected and evaluated in the current design step. If there is another design element to be selected and evaluated in the current design step, then the method loops to step 210, otherwise the method proceeds to step 250.

In step 250 it is determined if there is another sub-step is to be performed in the current design step. If in step 250, it is determined if there is another sub-step to be performed in the current design step then the method loops to step 205, otherwise the method proceeds to step 255.

In step 255, it is determined if there is another design step required for designing the integrated circuit. If in step 255, it is determined if there is another design step required for designing the integrated circuit then the method loops to step 200, otherwise the method terminates.

Figure 3:
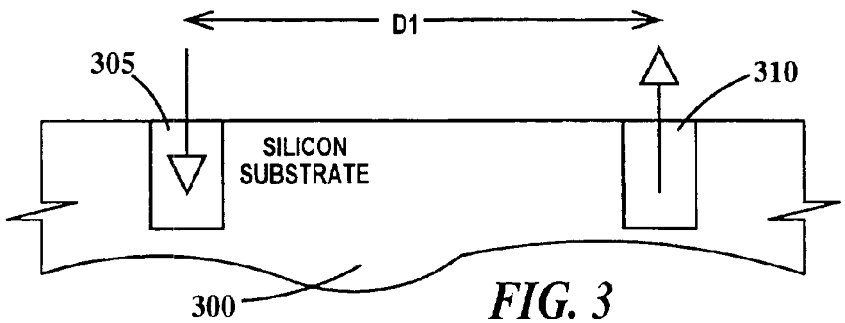
FIG. 3 is a schematic diagram of an exemplary preliminary design of elements of an integrated circuit to which the present invention is applied.

FIG. 3 is a schematic diagram of an exemplary preliminary design of elements of an integrated circuit to which the present invention is applied. In FIG. 3, as part of an integrated circuit design, contained in a silicon substrate is a sending device 305 a distance D1 from a receiving device 310 from a process tool kit. Sending device 305 has a noise signature parameter associated with it and receiving device 310 has a noise sensitivity parameter associated with it. This structure is to be optimized for noise as illustrated in FIG. 4 and described infra.

Figure 4:
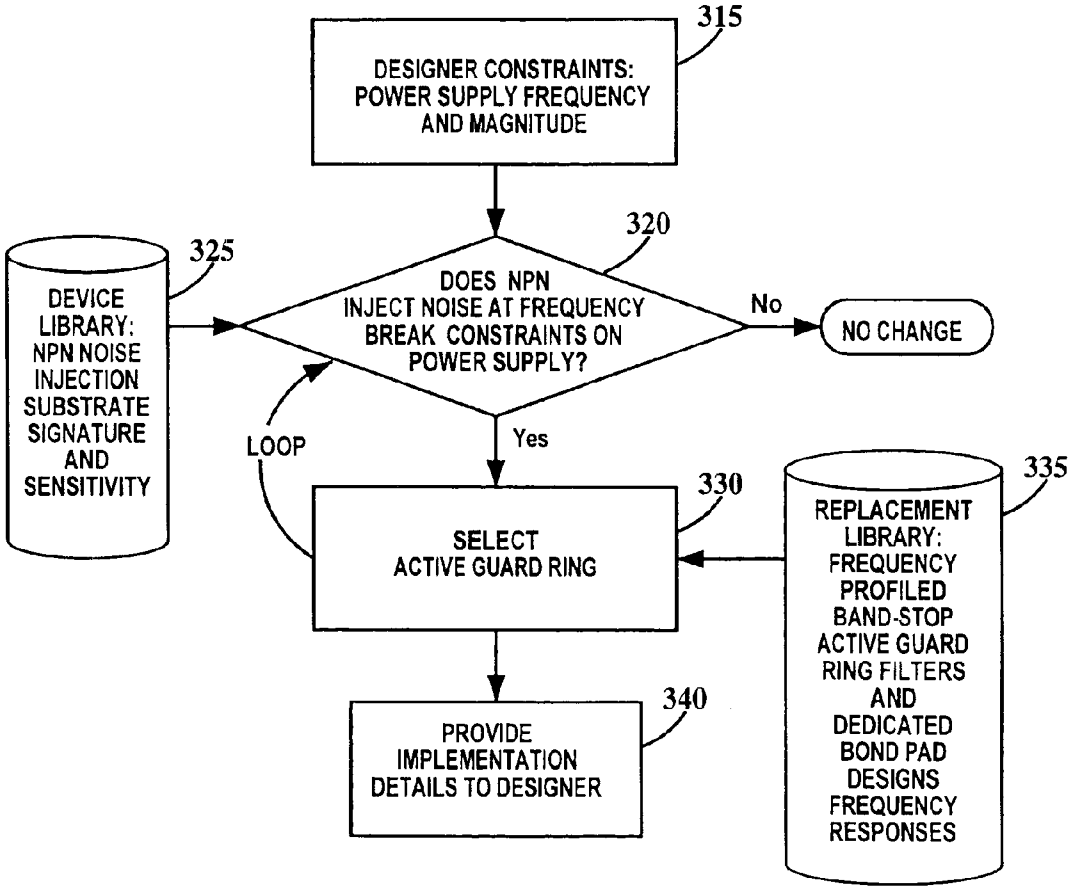
FIG. 4 is a flowchart illustrating the method of the present invention as applied to the exemplary preliminary design illustrated in FIG. 3.

FIG. 4 is a flowchart illustrating the method of the present invention as applied to the exemplary preliminary design illustrated in FIG. 3. In step 315, the particular noise constraints are selected by the designer. The noise constraints could also be selected automatically based on predetermined rules. In step 320 it is determined if the noise constraints of step 315 are met by the structure illustrated in FIG. 3, particular to the present example, the question Does NPN injection noise at the operating frequency break noise constraints on the power supply? is asked.

The noise signature, specifically, the substrate injection noise signature parameter of sending device 305 and the noise sensitivity parameter of receiving device 310 are determined from device library 325. If in step 320, the noise constraints are met than no further design action is required by the designer. However, if in step 320, the noise constraints are not met, then in step 330, a replacement element or noise suppression element is selected from library 335. Steps 320 and 330 are repeated until a replacement element or noise suppression element that allows noise constraints to be met is found. For exemplary purposes, library 335 contains frequency profiled band-stop active guard ring filters (a noise suppression device) and frequency responses of dedicated bond pad designs. The frequency profiling and frequency responses are forms of noise suppression parameters. Additionally other structures and replacement elements as described supra in reference to libraries 220 and 240 of FIG. 2 may be included in library 335.

In step 330, for exemplary purposes, an active guard ring is selected (after no or multiple loops) and in step 340, implementation details such as, for example, where to place the active guard ring, are presented to the designer. For the purposes of the present example, assume the implementation details state Place the active guard ring around receiving device 310 (see FIG. 3).

Figure 5A:
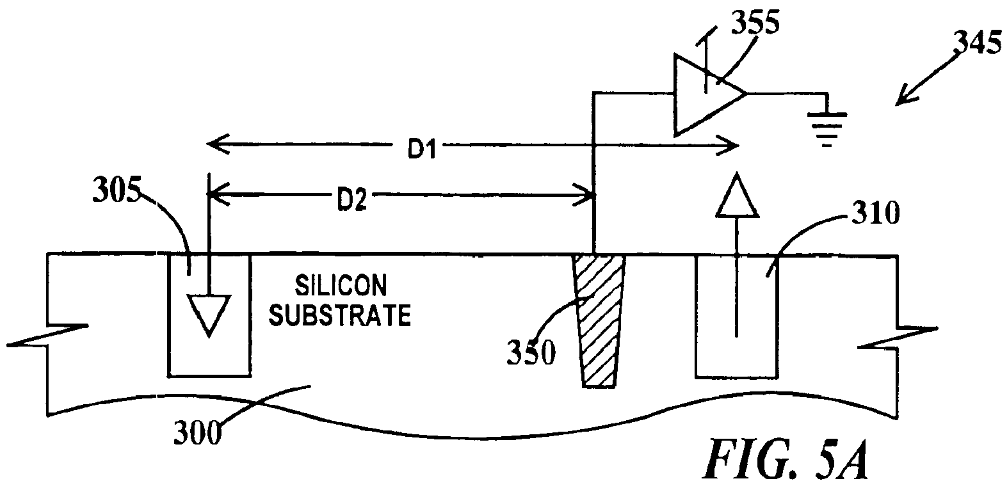
FIG. 5A illustrates a modified low noise design produced by the present invention as applied to the exemplary preliminary design illustrated in FIG. 3.

FIG. 5A illustrates a modified low noise design produced by the present invention as applied to the exemplary preliminary design illustrated in FIG. 3. FIG. 5A is similar to FIG. 3, except noise-suppression device 345 has been added to the integrated circuit design a distance D2 from sending device 305. Noise suppression device 345 is an active guard ring device as described supra in step 330 of FIG. 4 and includes a capacitive trench 350 surrounding receiving device 310 and an amplifier 355 connected trench 350 to ground.

Figure 5B:
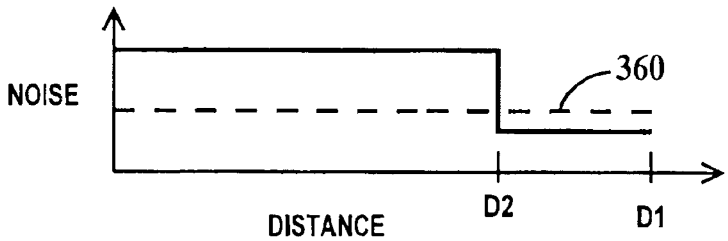
FIG. 5B illustrates the noise level between the elements of the modified low noise design illustrated in FIG. 5A.

FIG. 5B illustrates the noise level between the elements of the modified low noise design illustrated in FIG. 5A. In FIG. 5B substrate noise level is plotted versus distance. The distance scale of FIG. 5B is approximately the same as the distance scale in FIG. 5A. A noise constraint level 360 is also plotted in FIG. 5B. As can be seen, from distance 0 to D2, the noise level is above constraint level 360 and from distance D2 to D1 the noise level is below the constraint level.

Figure 6:
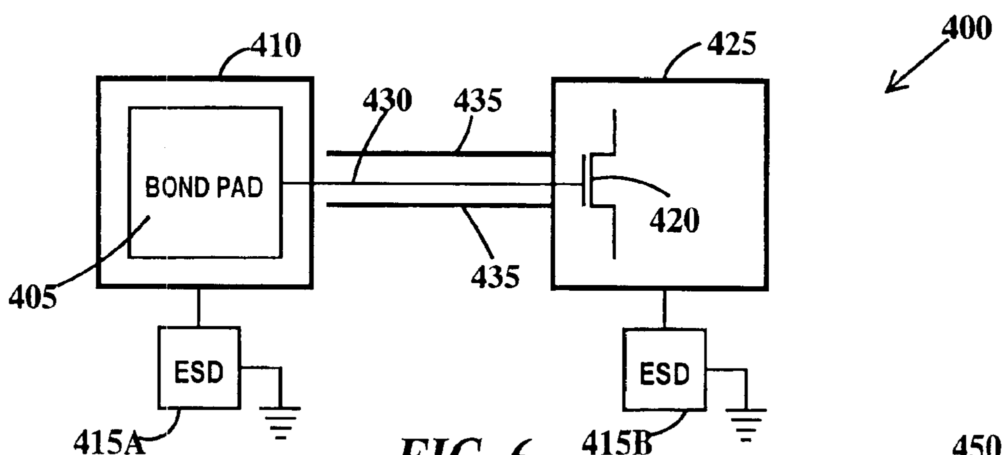
FIG. 6 is a schematic diagram of a second example of the application of the present invention to low noise design.

FIG. 6 is a schematic diagram of a second example of the application of the present invention to low noise design. In FIG. 6, an I/O circuit 400 includes a bond pad 405 surrounded by a guard ring 410 connected to an electrostatic discharge (ESD) device 415A. I/O circuit 400 further includes a high performance device 420 surrounded by a guard ring 425 connected to an ESD device 415B. Performance device 420 is connected to bond pad 405 by a transmission line 430. Transmission line 430 is shielded by shields 435. Note shields 435 are connected to guard ring 420 but not guard ring 410. Bond pad 405, performance device 420 and transmission line 430 may be considered as design elements that are to be matched to noise constraints. Guard rings 410 and 425, shields 435 and how the shields are connected to the guard rings may be considered as noise suppression elements selected from a library of alternative structures as described supra.

Figure 7:
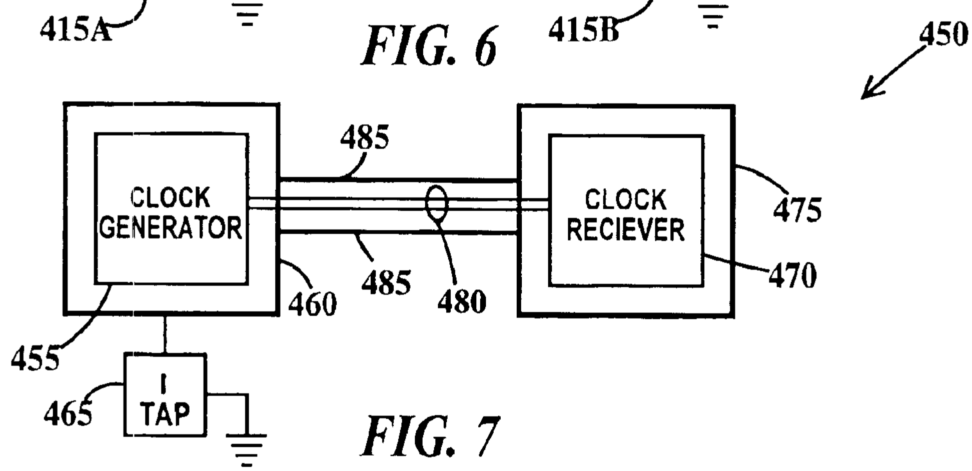
FIG. 7 is a schematic diagram of a third example of the application of the present invention to low noise design.

FIG. 7 is a schematic diagram of a third example of the application of the present invention to low noise design. In FIG. 7, a clock circuit 450 includes a clock generator 455 surrounded by a guard ring 460 connected to a current tap circuit 465. Clock circuit 450 further includes a clock receiver circuit 470 surrounded by a guard ring 470. Clock receiver circuit 470 is connected to clock generator 455 by a differential transmission line 480. Differential transmission line 480 is shielded by shields 485. Note shields 485 are connected to both guard ring 460 and guard ring 475. Clock generator 455, clock receiver 470 and differential transmission line 480 may be considered as design elements that are to be matched to noise constraints. Guard rings 460 and 475, shields 485 and how the shields are connected to the guard rings may be considered as noise suppression elements selected from a library of alternative structures as described supra.

Figure 8:
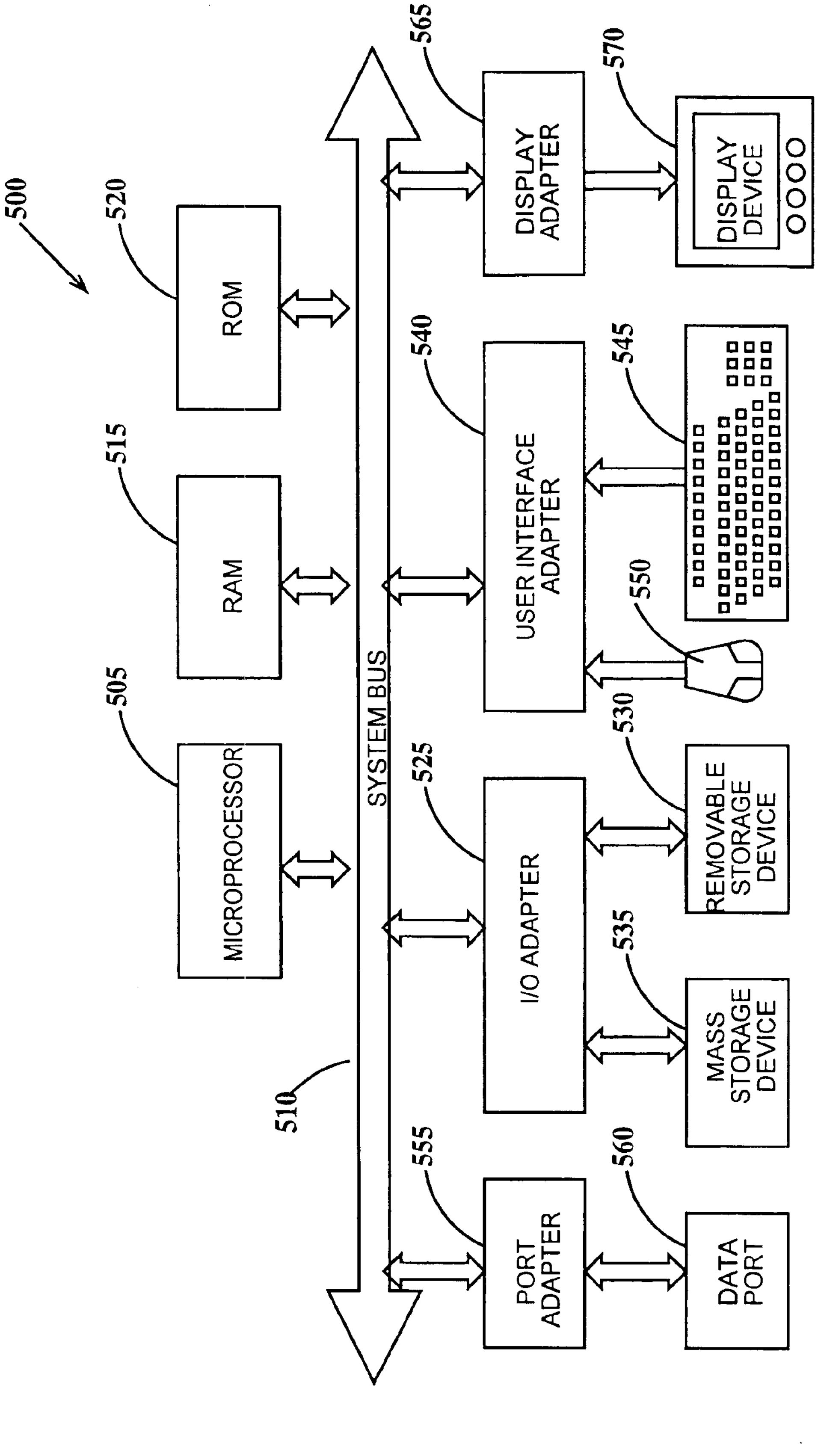
FIG. 8 is a schematic block diagram of a general-purpose computer for practicing the present invention.

Generally, the method described herein with respect to designing a low noise integrated circuit is practiced with a general-purpose computer and the method may be coded as a set of instructions on removable or hard media for use by the general-purpose computer. FIG. 8 is a schematic block diagram of a general-purpose computer for practicing the present invention. In FIG. 8, computer system 500 has at least one microprocessor or central processing unit (CPU) 505. CPU 505 is interconnected via a system bus 510 to a random access memory (RAM) 515, a read-only memory (ROM) 520, an input/output (I/O) adapter 525 for a connecting a removable data and/or program storage device 530 and a mass data and/or program storage device 535, a user interface adapter 540 for connecting a keyboard 545 and a mouse 550, a port adapter 555 for connecting a data port 560 and a display adapter 565 for connecting a display device 570.

ROM 520 contains the basic operating system for computer system 500. The operating system may alternatively reside in RAM 515 or elsewhere as is known in the art. Examples of removable data and/or program storage device 530 include magnetic media such as floppy drives and tape drives and optical media such as CD ROM drives. Examples of mass data and/or program storage device 535 include hard disk drives and non-volatile memory such as flash memory. In addition to keyboard 545 and mouse 550, other user input devices such as trackballs, writing tablets, pressure pads, microphones, light pens and position-sensing screen displays may be connected to user interface 540. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 530, fed through data port 560 or typed in using keyboard 545.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method for designing an integrated circuit by a user, comprising:

evaluating noise parameters for design elements of an integrated circuit design;

determining if said noise parameters meet noise constraints of said integrated circuit design;

if said determining has determined that said noise parameters do not meet said noise constraints, further determining if alternative design elements having noise parameters that do meet said noise constraints exist;

if said further determining has further determined that alternative design elements having noise parameters that do meet said noise constraints exist, selecting said alternative design elements and replacing said design elements with said alternative design elements; and for design elements not meeting said noise constraints and for which no alternative design element that meets said noise constraints exist, selecting noise suppression elements and integrating said noise suppression elements into said integrated circuit design, said noise suppression elements selected from the group consisting of band-stop guard ring filters, frequency response profiled bond pads, bond pads surrounded by band-stop guard ring filters, circuits surrounded by band-stop guard ring filters, shielded wires connected to circuit band-stop guard rings and shielded wires connecting circuit band-stop guard rings and bond pad band-stop guard rings.

2. The method of claim 1, further including presenting one or more of said alternative design elements to said user.

3. The method of claim 1, wherein said design elements are selected from the group consisting of single passive devices, single active devices, analog circuits, digital circuits, logic gates, functional blocks, transmission lines, transmission line shielding and noise suppression elements.

4. The method of claim 1, wherein said noise parameters comprise a noise suppression parameter.

5. The method of claim 1, wherein said alternative design elements are contained in or derived from process design kits.

6. The method of claim 5, wherein said process design kits are selected from the group consisting of standard process design kits, process design kits optimized for reduced noise sensitivity and reduced noise generation, and collections of circuits optimized for reduced noise sensitivity and reduced noise generation.

7. The method of claim 1, further including implementing said alternative design elements into one or more design tools, said design tools selected from the group consisting of chip floor planning tools, block design tools and physical integration and verification design tools.

8. The method of claim 1, further including:

providing implementation details for integrating said noise suppression elements into said integrated circuit design.

9. The method of claim 1, wherein said noise suppression elements consist of band-stop guard ring filters.

10. The method of claim 1, wherein said noise suppression elements consist of frequency response profiled bond pads.

11. The method of claim 1, wherein said noise suppression elements consist of bond pads surrounded by band-stop guard ring filters.

12. The method of claim 1, wherein said noise suppression elements consist of circuits surrounded by band-stop guard ring filters.

13. The method of claim 1, wherein said noise suppression elements consist of shielded wires connected to circuit band-stop guard rings.

14. The method of claim 1, wherein said noise suppression elements consist of shielded wires connecting circuit band-stop guard rings and bond pad band-stop guard rings.

15. A system for designing an integrated circuit by a user, comprising:

means for evaluating noise parameters for design elements of an integrated circuit design;

means for determining if said noise parameters meet noise constraints of said integrated circuit design;

means for determining if alternative design elements having noise parameters that do meet said noise constraints exist;

means for selecting said alternative design elements and replacing said design elements with said alternative design elements when said noise parameters of said design parameters do not meet said noise constraints and when said alternative design elements having noise parameters that do meet said noise constraints exist; and means for selecting noise suppression elements and means for integrating said noise suppression elements into said integrated circuit design for design elements when said design element and no alternative design element that meet said noise constraints exist, said noise suppression elements selected from the group consisting of band-stop guard ring filters, frequency response profiled bond pads, bond pads surrounded by band-stop guard ring filters, circuits surrounded by band-stop guard ring filters, shielded wires connected to circuit band-stop guard rings and shielded wires connecting circuit band-stop guard rings and bond pad band-stop guard rings.

16. The system of claim 15, further including means for presenting one or more or said alternative design elements to said user.

17. The system of claim 15, wherein said design elements are selected from the group consisting of single passive devices, single active devices, analog circuits, digital circuits, logic gates, functional blocks, transmission lines, transmission line shielding and noise suppression elements.

18. The system of claim 15, wherein said noise parameters comprise a noise suppression parameter.

19. The system of claim 15, wherein said alternative design elements are contained in or derived from process design kits.

20. The system of claim 19, wherein said process design kits are selected from the group consisting of standard process design kits, process design kits optimized for reduced noise sensitivity and reduced noise generation, and collections of circuits optimized for reduced noise sensitivity and reduced noise generation.

21. The system of claim 15, further including means for implementing said alternative design elements into one or more design tools, said design tools selected from the group consisting of chip floor planning tools, block design tools and physical integration and verification design tools.

22. The system of claim 15, further including:

means for providing implementation details for integrating said noise suppression elements into said integrated circuit design.

23. A program storage device readable by machine, tangibly embodying a program of instructions executable by the machine to perform method steps for or designing an integrated circuit by a user said method steps comprising:

evaluating noise parameters for design elements of an integrated circuit design;

determining if said noise parameters meet noise constraints of said integrated circuit design;

if said determining has determined that said noise parameters do not meet said noise constraints, further determining if alternative design elements having noise parameters that do meet said noise constraints exist;

if said further determining has further determined that alternative design elements having noise parameters that do meet said noise constraints exist, selecting said alternative design elements and replacing said design elements with said alternative design elements; and for design elements not meeting said noise constraints and for which no alternative design element that meets said noise constraints exist, selecting noise suppression elements and integrating said noise suppression elements into said integrated circuit design, said noise suppression elements selected from the group consisting of band-stop guard ring filters, frequency response profiled bond pads, bond pads surrounded by band-stop guard ring filters, circuits surrounded by band-stop guard ring filters, shielded wires connected to circuit band-stop guard rings and shielded wires connecting circuit band-stop guard rings and bond pad band-stop guard rings.

24. The program storage device of claim 23, further including the method steps of presenting one or more of said alternative design elements to said user.

* * * * *